(12) United States Patent
Lin et al.

(10) Patent No.: US 11,719,491 B2
(45) Date of Patent: Aug. 8, 2023

(54) HEAT TRANSFER MEMBER REINFORCEMENT STRUCTURE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 17/832,672

(22) Filed: Jun. 5, 2022

(65) Prior Publication Data
US 2022/0364796 A1 Nov. 17, 2022

Related U.S. Application Data

(63) Continuation of application No. 16/666,422, filed on Oct. 29, 2019, now abandoned.

(51) Int. Cl.
F28D 15/04 (2006.01)
H01L 23/427 (2006.01)
F28D 15/02 (2006.01)

(52) U.S. Cl.
CPC .......... *F28D 15/04* (2013.01); *F28D 15/0233* (2013.01); *F28F 2225/04* (2013.01); *H01L 23/427* (2013.01); *H01L 2924/0002* (2013.01)

(58) Field of Classification Search
CPC .. F28D 15/04; F28D 15/0233; F28F 2225/04; H01L 23/427; H01L 2924/002
USPC .................................................... 165/104.26
See application file for complete search history.

(56) References Cited

U.S. PATENT DOCUMENTS

| 3,834,457 | A | * | 9/1974 | Madsen | F28D 15/0233 29/890.032 |
| 4,046,190 | A | * | 9/1977 | Marcus | F28D 15/0233 165/104.26 |
| 5,427,174 | A | * | 6/1995 | Lomolino, Sr. | F28D 15/0233 165/104.33 |
| 8,313,220 | B2 | | 11/2012 | Chang | |
| 2003/0159806 | A1 | * | 8/2003 | Sehmbey | F28D 15/046 257/E23.088 |
| 2012/0018137 | A1 | * | 1/2012 | Chang | H01L 23/427 165/185 |

FOREIGN PATENT DOCUMENTS

CN 2481640 Y 3/2002
CN 201428893 Y 3/2010
(Continued)

OTHER PUBLICATIONS

Search Report dated May 15, 2020 issued by Taiwan Intellectual Property Office for counterpart application No. 108134265.
(Continued)

*Primary Examiner* — Justin M Jonaitis
(74) *Attorney, Agent, or Firm* — Brad J. Thorson; DeWitt LLP (57) ABSTRACT

A heat transfer member reinforcement structure includes a main body. The main body has a first side, a second side and a reinforcement member. The reinforcement member is selectively disposed between the first and second sides or inlaid in a sink formed on the first side. The reinforcement member is connected with the main body to enhance the structural strength of the main body.

6 Claims, 8 Drawing Sheets

(56) References Cited

FOREIGN PATENT DOCUMENTS

| | | |
|---|---|---|
| CN | 201782216 U | 4/2011 |
| CN | 103209569 A | 7/2013 |
| CN | 103700636 A | 4/2014 |
| CN | 104168739 A | 11/2014 |
| CN | 204217303 U | 3/2015 |
| CN | 105636403 A | 6/2016 |
| CN | 105722372 A | 6/2016 |
| CN | 108882644 A | 11/2018 |
| CN | 109906017 A | 6/2019 |
| JP | 2016-25216 A | 2/2016 |
| TW | M588235 | 12/2019 |
| WO | 2019156018 A1 | 8/2019 |

OTHER PUBLICATIONS

Search Report dated Apr. 24, 2020 issued by China National Intellectual Property Administration for counterpart application No. 2019109006487.

Search Report dated Sep. 21, 2020 issued by China National Intellectual Property Administration for counterpart application No. 2019109006487.

Search Report dated Jan. 4, 2021 issued by China National Intellectual Property Administration for counterpart application No. 2019109006487.

\* cited by examiner

HEAT TRANSFER MEMBER REINFORCEMENT STRUCTURE

The present application is a continuation of U.S. patent application Ser. No. 16/666,422, filed on Oct. 29, 2019.

BACKGROUND OF THE INVENTION

1. Field of the Invention

The present invention relates generally to a heat transfer member reinforcement structure, and more particularly to a heat transfer member reinforcement structure, which is connected with the heat transfer member to enhance the structural strength of the heat transfer member.

2. Description of the Related Art

A common electronic apparatus has multiple electronic components therein, such as central processing unit. In operation, the electronic components will generate a great amount of heat. In case the heat generated by the electronic components is not dissipated in time, the temperature of the working environment of the electronic components will rise to seriously affect the normal operation of the electronic components. Therefore, in general, a heat dissipation member such as heat sink or radiating fins or a heat conduction unit such as heat conduction base seat or vapor chamber or flat-plate heat pipe is securely disposed on the surface of the heat generation electronic components to achieve heat dissipation and heat transfer effect.

Generally, the heat dissipation member or the heat conduction unit is located in such a manner that the heat dissipation member or the heat conduction unit is directly latched on a proper section of the periphery of the electronic member (CPU) on the motherboard by means of a leaf spring or a latching device. Accordingly, the heat dissipation member or the heat conduction unit will relatively apply a pressing force to the electronic member.

However, in structural design, the motherboard cannot bear great force. Therefore, according to the above securing means, the weight of the heat dissipation member or the heat conduction unit will improperly force the motherboard to cause damage of the motherboard. In order to avoid this, a conventional securing structure for the heat dissipation member or the heat conduction unit is provided. A board body is positioned under the motherboard and multiple fixing members are passed through the perforations of the motherboard to secure the board body to the heat dissipation member or the heat conduction unit on the motherboard. Accordingly, the motherboard is protected from being damaged due to improper application force. However, the board body can simply increase the strength of the motherboard. When a greater downward pressing force is applied to the heat dissipation member or the heat conduction unit, the heat dissipation member will be bent or broken or damaged.

It is therefore tried by the applicant to provide a heat transfer member reinforcement structure to increase the structural strength of the heat dissipation member or the heat conduction base seat.

SUMMARY OF THE INVENTION

It is therefore a primary object of the present invention to provide a heat transfer member reinforcement structure capable of increasing the strength of the heat transfer member.

To achieve the above and other objects, the heat transfer member reinforcement structure of the present invention includes a main body.

The main body has a first side, a second side and a reinforcement member. The reinforcement member is selectively disposed between the first and second sides or engaged (inserted) in the lateral sides of the main body or the second side of the main body. The reinforcement member is connected with the main body to enhance the structural strength of the main body.

The heat transfer member reinforcement structure is able to enhance the structural strength of the heat transfer member. Therefore, the heat transfer member has better strength so that when the heat transfer member is secured, the heat transfer member can bear greater downward or upward pressure or tension without deforming or damaging.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
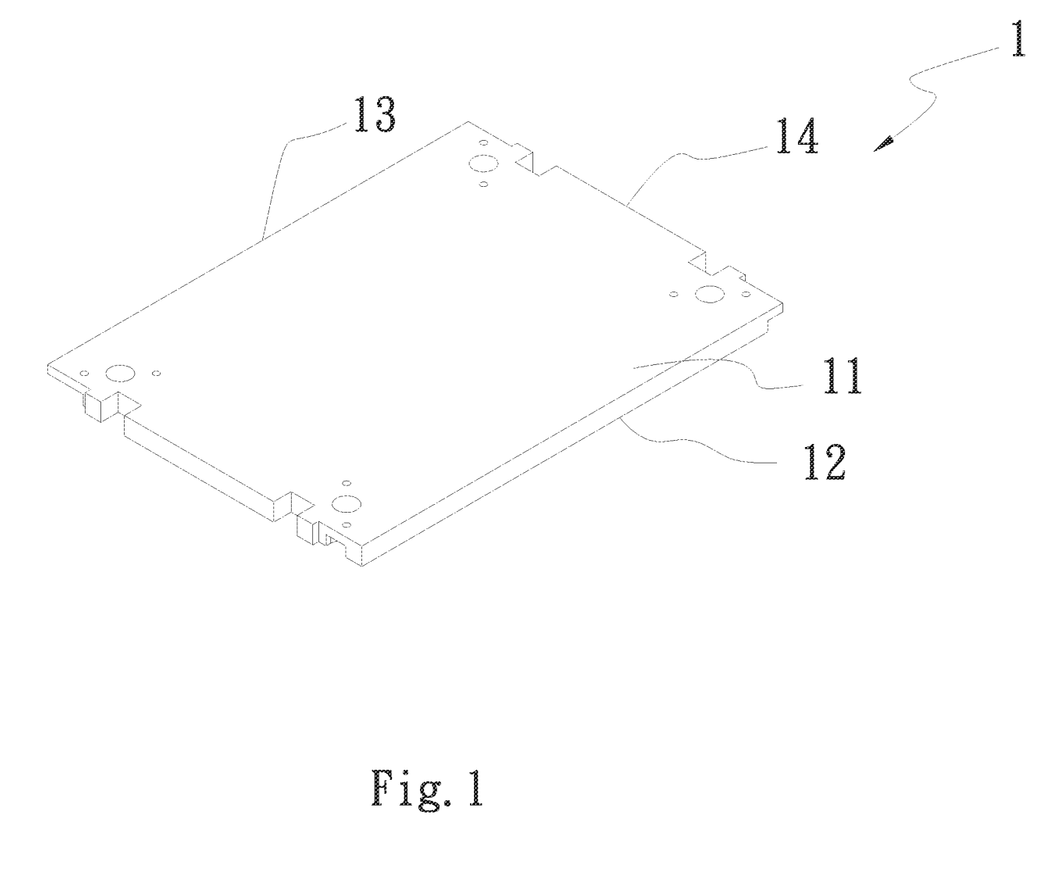
FIG. 1 is a perspective view of a first embodiment of the heat transfer member reinforcement structure of the present invention.
Figure 2:
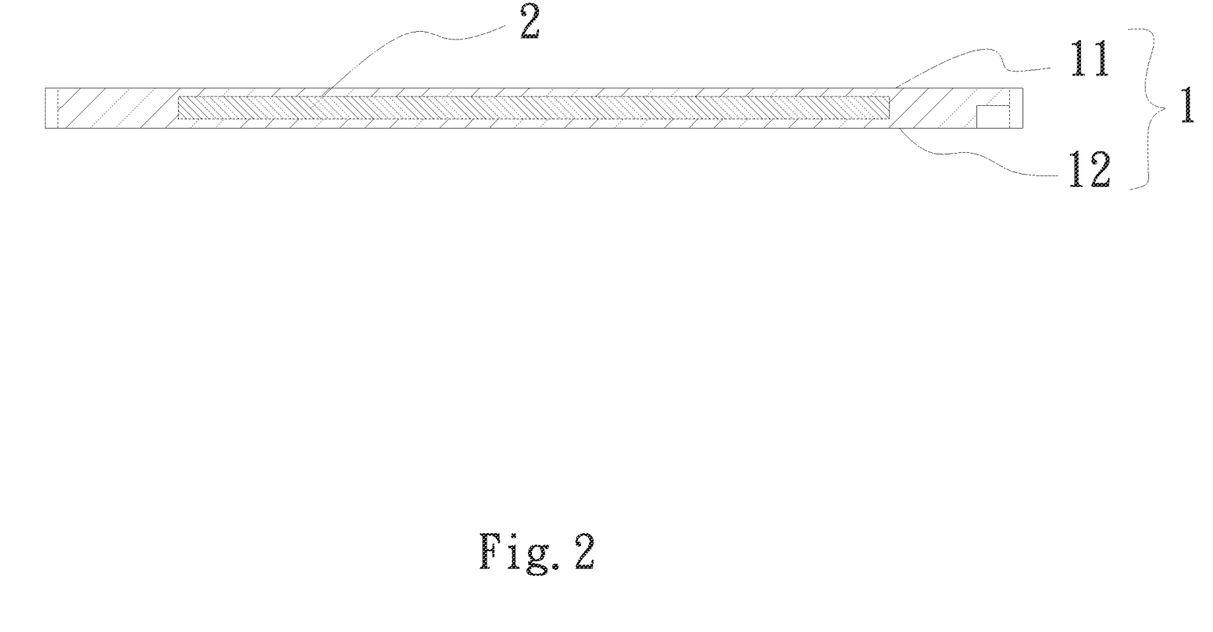
FIG. 2 is a sectional view of the first embodiment of the heat transfer member reinforcement structure of the present invention.

Please refer to FIGS. 1 and 2. FIG. 1 is a perspective view of a first embodiment of the heat transfer member reinforcement structure of the present invention. FIG. 2 is a sectional view of the first embodiment of the heat transfer member reinforcement structure of the present invention. As shown in the drawings, the heat transfer member reinforcement structure of the present invention includes a main body 1.

The main body 1 has a first side 11, a second side 12 and a reinforcement member 2. The first and second sides 11, 12 are respectively positioned on upper and lower sides of the main body 1. The reinforcement member 2 is disposed between the first and second sides 11, 12.

The main body 1 and the reinforcement member 2 are made of metal or nonmetal material. The metal material is selected from a group consisting of gold, silver, copper, aluminum, iron, stainless steel, titanium, aluminum alloy, copper alloy, titanium alloy and alloy. The nonmetal material is selected from a group consisting of ceramic, plastic and stone material. The main body 1 and the reinforcement member 2 can be selectively made of the same material or different materials in combination with each other. The reinforcement member 2 is in the form of an elongated bar, an elongated cylindrical body, an elongated flat body, an X-shaped body, a square frame body or any other geometrical body.

In this embodiment, the reinforcement member 2 is fully embedded in the main body 1 by means of integral insert injection molding. In this embodiment, the main body 1 is a heat conduction base seat or a heat sink. The reinforcement member 2 is fully embedded in the main body 1 by means of integral insert injection molding. Alternatively, the main body 1 and the reinforcement member 2 are integrally connected with each other by means of die casting or casting. The main body 1 has a pair of first lateral sides 13 and a pair of second lateral sides 14. The reinforcement member 2 can be selectively correspondingly disposed in a position in adjacency to the first lateral sides 13 or the second lateral sides 14 or disposed in four corners of the main body 1 or disposed in any section of the main body 1 that needs to be reinforced. The position of the reinforcement member 2 is not limited. In addition, there can be one single reinforcement member 2 or pairs of reinforcement members 2 disposed corresponding to each other.

Figure 3:
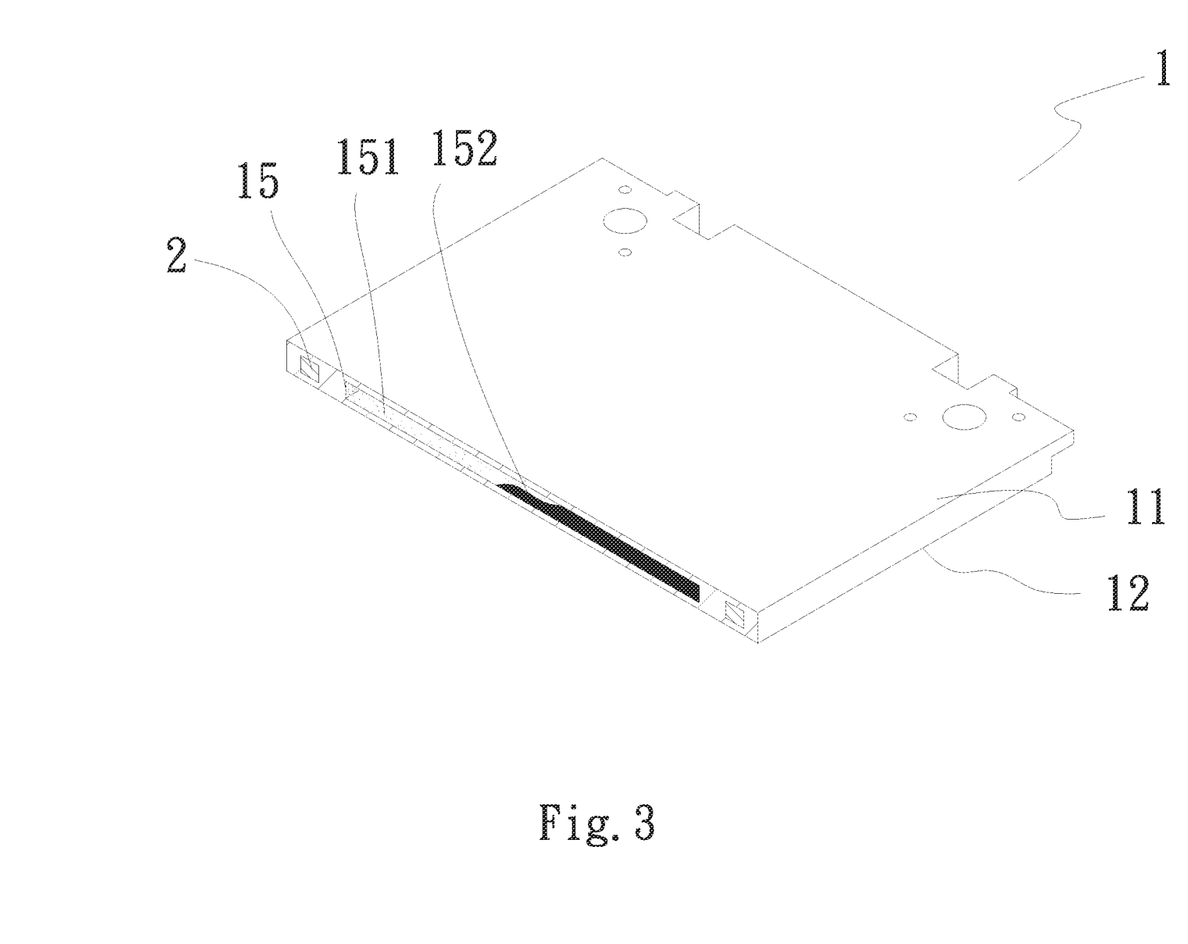
FIG. 3 is a perspective sectional view of a second embodiment of the heat transfer member reinforcement structure of the present invention.

Please now refer to FIG. 3, which is a perspective sectional view of a second embodiment of the heat transfer member reinforcement structure of the present invention. The second embodiment is partially identical to the first embodiment in structure and thus will not be redundantly described hereinafter. The second embodiment is different from the first embodiment in that the main body 1 is a heat conduction member, which is a vapor chamber. Accordingly, an airtight chamber 15 is formed between the first and second sides 11, 12 of the main body 1. The reinforcement member 2 is disposed in a section outside the airtight chamber 15 of the main body 1. For example, the reinforcement member 2 is disposed in any position of the first or second side of the main body 1 or disposed between the airtight chamber 15 and the first and second sides 11, 12 of the main body 1. A capillary structure 151 is disposed in the airtight chamber 15 and a working liquid 152 is contained in the airtight chamber 15.

Figure 4:
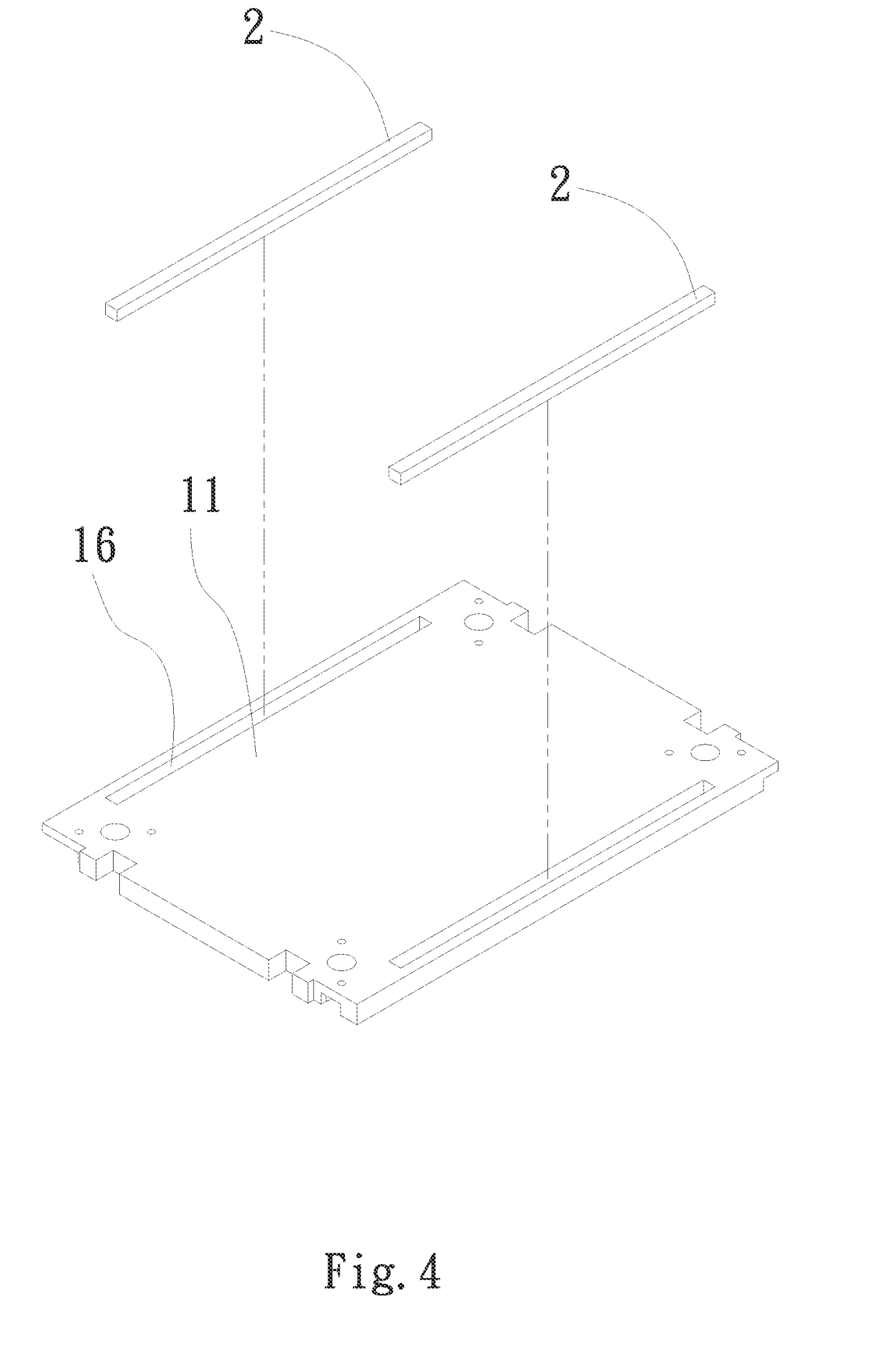
FIG. 4 is a perspective view of a third embodiment of the heat transfer member reinforcement structure of the present invention.
Figure 5A:
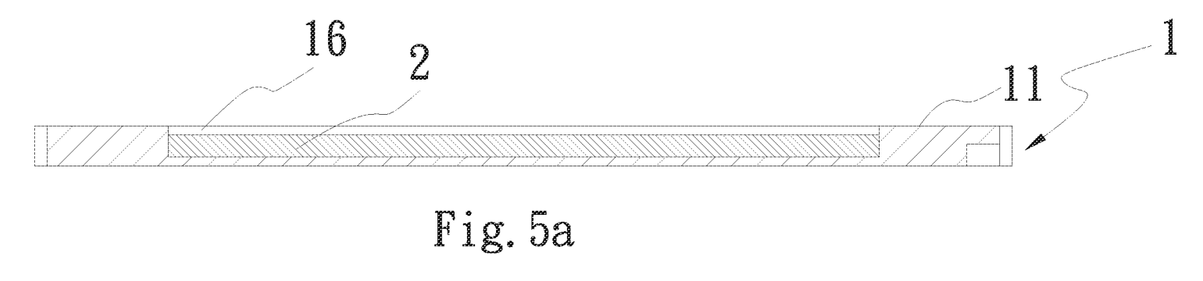
FIG. 5a is a sectional view of the third embodiment of the heat transfer member reinforcement structure of the present invention.
Figure 5B:
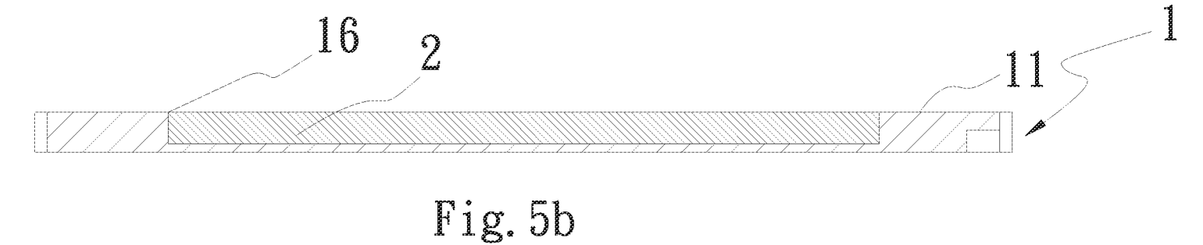
FIG. 5b is a sectional view of the third embodiment of the heat transfer member reinforcement structure of the present invention.
Figure 5C:
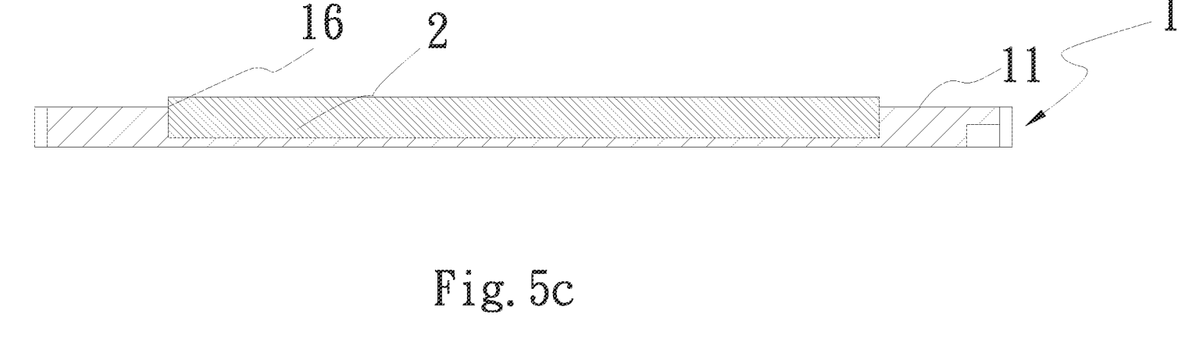
FIG. 5c is a sectional view of the third embodiment of the heat transfer member reinforcement structure of the present invention.

Please now refer to FIGS. 4, 5a, 5b and 5c. FIG. 4 is a perspective view of a third embodiment of the heat transfer member reinforcement structure of the present invention. FIG. 5a is a sectional view of the third embodiment of the heat transfer member reinforcement structure of the present invention. FIG. 5b is a sectional view of the third embodiment of the heat transfer member reinforcement structure of the present invention. FIG. 5c is a sectional view of the third embodiment of the heat transfer member reinforcement structure of the present invention. The third embodiment is partially identical to the first embodiment in structure and thus will not be redundantly described hereinafter. The third embodiment is different from the first embodiment in that the main body 1 is a heat conduction base seat and the first side 11 of the main body 1 is formed with a sink 16. The reinforcement member 2 is disposed in the sink 16 by means of die casting, pressing, welding or engagement. The reinforcement member 2 is selectively lower than the first side 11 (as shown in FIG. 5a) or flush with the first side 11 (as shown in FIG. 5b) or raised from the first side 11 (as shown in FIG. 5c).

Figure 6:
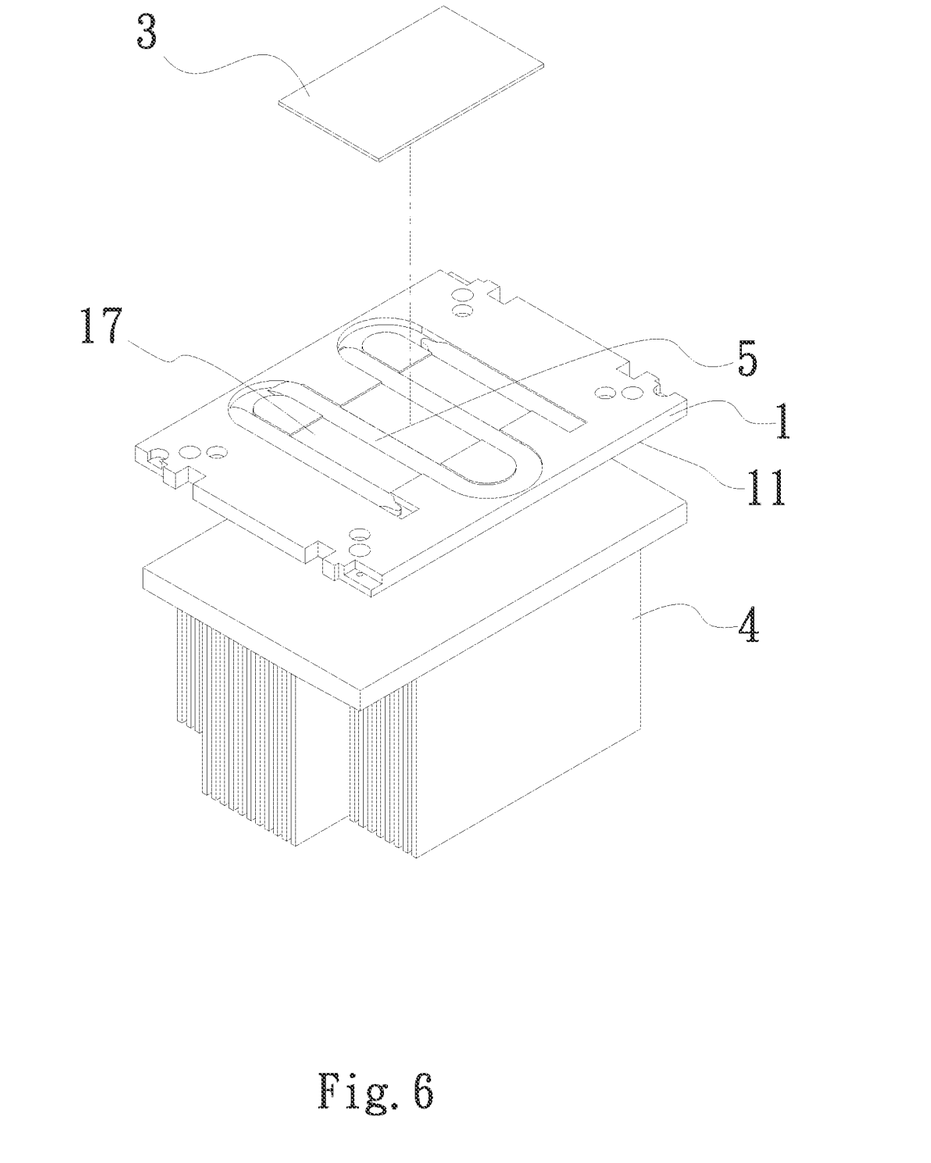
FIG. 6 is a perspective view of a fourth embodiment of the heat transfer member reinforcement structure of the present invention.

Please now refer to FIG. 6, which is a perspective view of a fourth embodiment of the heat transfer member reinforcement structure of the present invention. The fourth embodiment is partially identical to the first embodiment in structure and thus will not be redundantly described hereinafter. The fourth embodiment is different from the first embodiment in that the main body 1 is a heat conduction base seat or a heat sink. The center of the main body 1 is formed with a perforation 17, in which a heat conduction block 3 is inserted (inlaid). The first side 11 of the main body 1 is mated with a heat dissipation unit 4. The heat dissipation unit 4 is a heat sink or a radiating fin assembly. Multiple heat pipes 5 are connected with the heat conduction block 3 and the heat dissipation unit 4.

Figure 7:
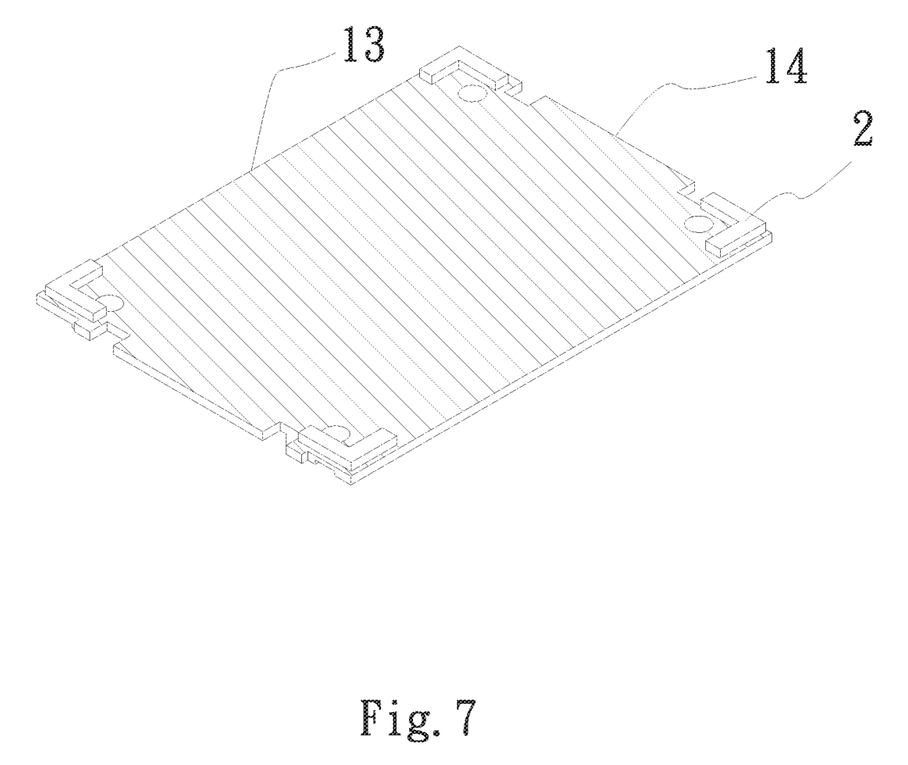
FIG. 7 is a sectional view of a fifth embodiment of the heat transfer member reinforcement structure of the present invention.

Please now refer to FIG. 7, which is a sectional view of a fifth embodiment of the heat transfer member reinforcement structure of the present invention. The fifth embodiment is partially identical to the first embodiment in structure and thus will not be redundantly described hereinafter. The fifth embodiment is different from the first embodiment in that the reinforcement members 2 are correspondingly disposed at the junctions between the first and second lateral sides 13, 14 in four corners or extend from the four corners and intersect each other.

Figure 8:
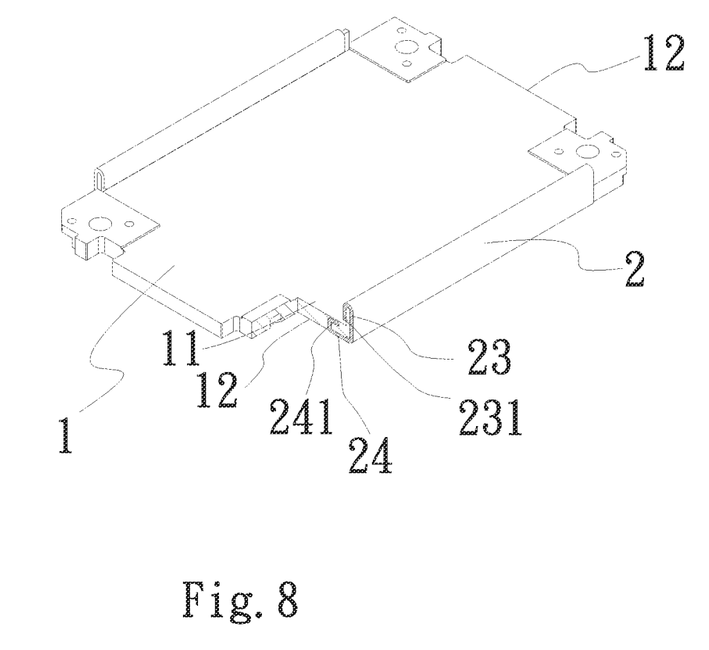
FIG. 8 is a perspective partially sectional view of a sixth embodiment of the heat transfer member reinforcement structure of the present invention.

Please now refer to FIG. 8, which is a perspective partially sectional view of a sixth embodiment of the heat transfer member reinforcement structure of the present invention. The sixth embodiment is partially identical to the first embodiment in structure and thus will not be redundantly described hereinafter. The sixth embodiment is different from the first embodiment in that the reinforcement member 2 has a first section 23 and a second section 24. The first and second sections 23, 24 are perpendicularly connected with each other. One end of the first section 23 has a hook end 231 hooked and latched on outer side of a side rib 133 protruding from a long side 13 of the first side 11 of the main body 1. The second section 24 has an extension section 241. The second section 24 is snugly attached to the second side 12 of the main body 1 with the extension section 241 disposed between the first and second sides 11, 12 by means of integral insert injection molding.

The heat transfer member of the present invention can be a heat conduction member, a heat conduction base seat, a heat sink, a vapor chamber or a heat transfer unit. When the heat transfer member is secured to bear a resistance of pressure or bending force, the reinforcement member 2 can be disposed (arranged) to greatly enhance the structural strength of the heat conduction member, heat conduction base seat, heat sink, vapor chamber or heat transfer unit. Accordingly, the heat transfer member is protected from being deformed or damaged due to the pressure or bending force in assembling process.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat transfer member reinforcement structure comprising a main body, the main body being a chamber and having a first side, a second side and a reinforcement member, an airtight chamber formed between the first and second sides of the main body, a capillary structure being disposed in the airtight chamber, a working liquid being contained in the airtight chamber, the reinforcement member being fully embedded in the main body by means of integral insert injection molding.

2. The heat transfer member reinforcement structure as claimed in claim 1, wherein the main body has a pair of first lateral sides and a pair of second lateral sides, the reinforcement member being correspondingly disposed in a position in adjacency to the first lateral sides or the second lateral sides.

3. The heat transfer member reinforcement structure as claimed in claim 1, wherein the main body and the reinforcement member are made of metal or nonmetal material, the metal material being selected from a group consisting of gold, silver, copper, aluminum, iron, stainless steel, titanium, aluminum alloy, copper alloy, titanium alloy and alloy, the nonmetal material being selected from a group consisting of ceramic, plastic and stone material, the main body and the reinforcement member being selectively made of the same material or different materials in combination with each other.

4. A heat transfer member reinforcement structure comprising a main body, the main body having a first side and a second side, the first side being formed with a sink, the reinforcement member being disposed in the sink by means of integral insert injection molding, an airtight chamber formed between the first and second sides of the main body, a capillary structure being disposed in the airtight chamber, a working liquid being contained in the airtight chamber, the reinforcement member being selectively lower than the first side or flush with the first side or raised from the first side.

5. The heat transfer member reinforcement structure as claimed in claim 4, wherein the main body has a pair of first lateral sides and a pair of second lateral sides, the reinforcement member being correspondingly disposed in a position in adjacency to the first lateral sides.

6. The heat transfer member reinforcement structure as claimed in claim 4, wherein the main body and the reinforcement member are made of metal or nonmetal material, the metal material being selected from a group consisting of gold, silver, copper, aluminum, iron, stainless steel, titanium, aluminum alloy, copper alloy, titanium alloy and alloy, the nonmetal material being selected from a group consisting of ceramic, plastic and stone material, the main body and the reinforcement member being selectively made of the same material or different materials in combination with each other.

* * * * *